(12) United States Patent
Nair et al.

(10) Patent No.: US 10,147,710 B2
(45) Date of Patent: Dec. 4, 2018

(54) METHOD OF EMBEDDING WLCSP COMPONENTS IN E-WLB AND E-PLB

(71) Applicant: Intel Corporation, Santa Clara, CA (US)

(72) Inventors: Vijay K. Nair, Mesa, AZ (US); Thorsten Meyer, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/982,787

(22) Filed: May 17, 2018

(65) Prior Publication Data

US 2018/0269190 A1    Sep. 20, 2018

Related U.S. Application Data

(62) Division of application No. 14/767,902, filed as application No. PCT/US2014/056406 on Sep. 18, 2014, now Pat. No. 9,991,239.

(51) Int. Cl.
*H01L 21/44* (2006.01)
*H01L 25/16* (2006.01)
(Continued)

(52) U.S. Cl.
CPC .......... *H01L 25/162* (2013.01); *H01L 21/568* (2013.01); *H01L 24/05* (2013.01);
(Continued)

(58) Field of Classification Search
CPC ..... H01L 25/162; H01L 21/568; H01L 24/14; H01L 24/15; H01L 24/19; H01L 24/97
(Continued)

(56) References Cited

U.S. PATENT DOCUMENTS

| 5,405,808 A | 4/1995 | Rostoker et al. |
| 5,650,659 A | 7/1997 | Mostafazadeh et al. |

(Continued)

FOREIGN PATENT DOCUMENTS

| JP | 2004530285 | 10/2001 |
| JP | 2004241660 | 8/2004 |

(Continued)

OTHER PUBLICATIONS

Notice of Allowance and Search Report for Russian Application No. 2017105094, dated Mar. 15, 2018, 13 pages.

(Continued)

*Primary Examiner* — Nitin Parekh
(74) *Attorney, Agent, or Firm* — Schwabe, Williamson & Wyatt, P.C.

(57) ABSTRACT

Embodiments of the invention include multi-die package and methods of making such multi-die packages. In an embodiment a mold layer has a first surface and a second surface that is opposite from the first surface. One or more first electrical components that each have a solderable terminal that is oriented to face the first surface of the mold layer. The mold layer may also have one or more second electrical components that each have a second type of terminal that is oriented to face the second surface of the mold layer. Embodiments may also include one or more conductive through vias formed between the first surface of the mold layer and the second surface of the mold layer. Accordingly an electrical connection may be made from the second surface of the mold layer to the first electrical components that are oriented to face the first surface of the mold layer.

7 Claims, 8 Drawing Sheets

(51) Int. Cl.
  *H01L 23/00* (2006.01)
  *H01L 21/56* (2006.01)
  *H01L 25/00* (2006.01)
  *H01L 25/10* (2006.01)
  *H01L 25/03* (2006.01)
  *H01L 23/538* (2006.01)

(52) U.S. Cl.
  CPC ............. *H01L 24/16* (2013.01); *H01L 24/19* (2013.01); *H01L 24/20* (2013.01); *H01L 24/96* (2013.01); *H01L 24/97* (2013.01); *H01L 25/03* (2013.01); *H01L 25/105* (2013.01); *H01L 25/50* (2013.01); *H01L 23/5389* (2013.01); *H01L 2224/04105* (2013.01); *H01L 2224/05571* (2013.01); *H01L 2224/05611* (2013.01); *H01L 2224/12105* (2013.01); *H01L 2224/131* (2013.01); *H01L 2224/16145* (2013.01); *H01L 2224/16227* (2013.01); *H01L 2224/16505* (2013.01); *H01L 2224/24137* (2013.01); *H01L 2224/24195* (2013.01); *H01L 2224/48227* (2013.01); *H01L 2224/96* (2013.01); *H01L 2225/0652* (2013.01); *H01L 2225/06517* (2013.01); *H01L 2225/06548* (2013.01); *H01L 2225/06555* (2013.01); *H01L 2225/06572* (2013.01); *H01L 2225/1035* (2013.01); *H01L 2225/1041* (2013.01); *H01L 2225/1058* (2013.01); *H01L 2924/00014* (2013.01); *H01L 2924/01013* (2013.01); *H01L 2924/01029* (2013.01); *H01L 2924/01079* (2013.01); *H01L 2924/141* (2013.01); *H01L 2924/1421* (2013.01); *H01L 2924/1434* (2013.01); *H01L 2924/15192* (2013.01); *H01L 2924/15311* (2013.01); *H01L 2924/15313* (2013.01); *H01L 2924/15321* (2013.01); *H01L 2924/15323* (2013.01); *H01L 2924/15331* (2013.01); *H01L 2924/19011* (2013.01); *H01L 2924/19041* (2013.01); *H01L 2924/19043* (2013.01); *H01L 2924/19105* (2013.01); *H01L 2924/3651* (2013.01)

(58) Field of Classification Search
  USPC ......................................................... 438/127
  See application file for complete search history.

(56) References Cited

U.S. PATENT DOCUMENTS

| | | | |
|---|---|---|---|
| 6,007,317 | A | 12/1999 | Mess |
| 7,394,663 | B2 | 7/2008 | Yamashita et al. |
| 7,642,656 | B2 | 1/2010 | Yoo et al. |
| 7,670,866 | B2 | 3/2010 | Sun et al. |
| 7,838,337 | B2 | 11/2010 | Marimuthu |
| 7,875,497 | B2 | 1/2011 | Yoo et al. |
| 7,875,983 | B2 | 1/2011 | Yoo et al. |
| 8,017,437 | B2 | 9/2011 | Yoo |
| 8,039,303 | B2* | 10/2011 | Shim .............. H01L 21/568 438/107 |
| 8,097,490 | B1* | 1/2012 | Pagaila ............. H01L 21/561 438/106 |
| 8,466,544 | B2* | 6/2013 | Pagaila ............. H01L 21/486 257/686 |
| 8,471,361 | B2 | 6/2013 | Lin et al. |
| 8,476,120 | B2 | 7/2013 | Huang |
| 8,604,597 | B2 | 12/2013 | Jiang |
| 9,385,052 | B2 | 7/2016 | Lin |
| 2004/0154163 | A1 | 8/2004 | Miyazaki et al. |
| 2004/0207064 | A1 | 10/2004 | Brooks et al. |
| 2005/0029644 | A1 | 2/2005 | Ho et al. |
| 2005/0093152 | A1 | 5/2005 | Fjelstad et al. |
| 2007/0141751 | A1 | 6/2007 | Mistry et al. |
| 2008/0211078 | A1 | 9/2008 | Kwon et al. |
| 2008/0284066 | A1 | 11/2008 | Kuan et al. |
| 2008/0316714 | A1 | 12/2008 | Eichelberger et al. |
| 2009/0267220 | A1 | 10/2009 | Kuhlman et al. |
| 2009/0309212 | A1 | 12/2009 | Shim et al. |
| 2010/0006994 | A1 | 1/2010 | Shim et al. |
| 2010/0237481 | A1 | 9/2010 | Chi et al. |
| 2010/0244233 | A1* | 9/2010 | Kim ................ H01L 21/561 257/693 |
| 2011/0001247 | A1 | 1/2011 | Jobetto |
| 2011/0042798 | A1 | 2/2011 | Pagaila et al. |
| 2011/0285007 | A1 | 11/2011 | Chi |
| 2012/0049338 | A1 | 3/2012 | Chen |
| 2012/0056312 | A1 | 3/2012 | Pagaila et al. |
| 2012/0159118 | A1 | 6/2012 | Wong |
| 2012/0161331 | A1 | 6/2012 | Gonzalez |
| 2012/0211885 | A1 | 8/2012 | Choi |
| 2012/0228782 | A1 | 9/2012 | Kawata et al. |
| 2012/0273960 | A1 | 11/2012 | Park et al. |
| 2013/0009325 | A1 | 1/2013 | Mori et al. |
| 2013/0075899 | A1* | 3/2013 | Huang ............... H01L 21/6835 257/737 |
| 2013/0075903 | A1 | 3/2013 | Pagaila et al. |
| 2013/0119549 | A1 | 5/2013 | Cheng et al. |
| 2013/0122700 | A1 | 5/2013 | Wu et al. |
| 2014/0042565 | A1 | 2/2014 | Fuergut et al. |
| 2014/0167247 | A1 | 6/2014 | Magnus et al. |
| 2014/0264839 | A1* | 9/2014 | Tsai ................ H01L 23/49816 257/737 |
| 2015/0187608 | A1* | 7/2015 | Ganesan ........... H01L 23/49811 257/738 |
| 2016/0358889 | A1* | 12/2016 | Lai ........................ H01L 23/481 |

FOREIGN PATENT DOCUMENTS

| | | |
|---|---|---|
| JP | 2004-274035 | 9/2004 |
| JP | 200762186 | 3/2007 |
| JP | 2009520366 | 5/2008 |
| JP | 2011029602 | 2/2011 |
| JP | 2014099526 | 5/2014 |
| KR | 20080077177 | 8/2008 |
| KR | 10-0865125 | 10/2008 |
| KR | 20140035803 | 3/2014 |
| TW | 200507197 | 2/2005 |
| TW | 200607028 | 2/2006 |
| TW | 201140792 | 11/2011 |
| TW | 201426965 | 7/2014 |
| WO | WO 2007120282 | 10/2007 |
| WO | WO 2011064971 | 6/2011 |
| WO | WO 2013009741 | 1/2013 |

OTHER PUBLICATIONS

Office Action for Chinese Patent Application No. 20140009301.9 dated Jan. 30, 2018, 11 pages.

Office Action from Korean Patent Application No. 2015-7022144, dated Mar. 31, 2017, 8 pages.

Office Action for Japanese Patent Application No. 2016-549015, dated Oct. 18, 2016, 11 pages.

Office Action for Korean Patent Application No. 2015-7022144, dated Sep. 19, 2016, 19 pages.

Office Action from Taiwan Office Action No. 104126252 dated Sep. 26, 2016, 13 pages.

Office Action for Taiwan Patent Application No. 104126252 dated Jun. 8, 2016, 35 pages.

International Search Report and Written Opinion of the International Searching Authority for PCT/US2014/056406 dated Jun. 18, 2015, 9 pages.

Partial European Search Report for EP Patent Application No. 14882122.6 dated Jun. 6, 2018, 18 pages.

Office Action from Korean Patent Application No. 2015-7022144, dated Jul. 13, 2017, 5 pages.

Office Action from Korean Patent Application No. 10-2017-7022527, dated Nov. 9, 2017, 3 pages.

(56) References Cited

OTHER PUBLICATIONS

Office Action for Taiwan Patent Application No. 104126252 dated Jul. 7, 2017, 19 pages.
Notice of Allowance for Taiwan Patent Application No. 104126252 dated Oct. 17, 2017, 2 pages.
International Preliminary Report on Patentablity for PCT/US2014/056406 dated Mar. 30, 2017, 8 pages.
Office Action for U.S. Appl. No. 14/7687,902 dated Nov. 1, 2016, 12 pages.
Office Action for U.S. Appl. No. 14/7687,902 dated Mar. 2, 2017, 15 pages.
Office Action for U.S. Appl. No. 14/7687,902 dated Jul. 28, 2017, 16 pages.
Search Report for European Patent Application No. 14882122.6 dated Sep. 6, 2018, 15 pages.

* cited by examiner

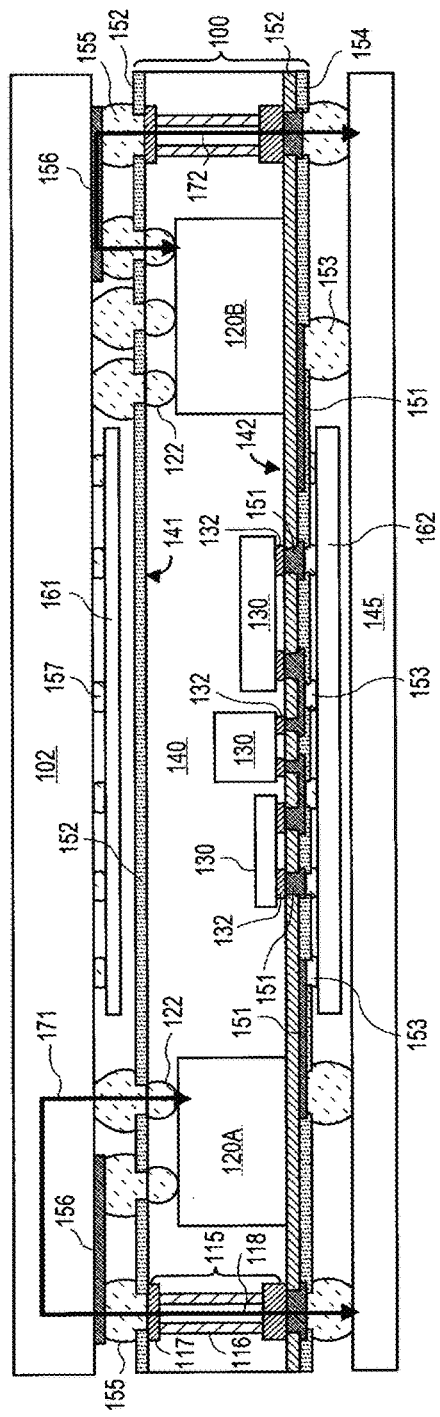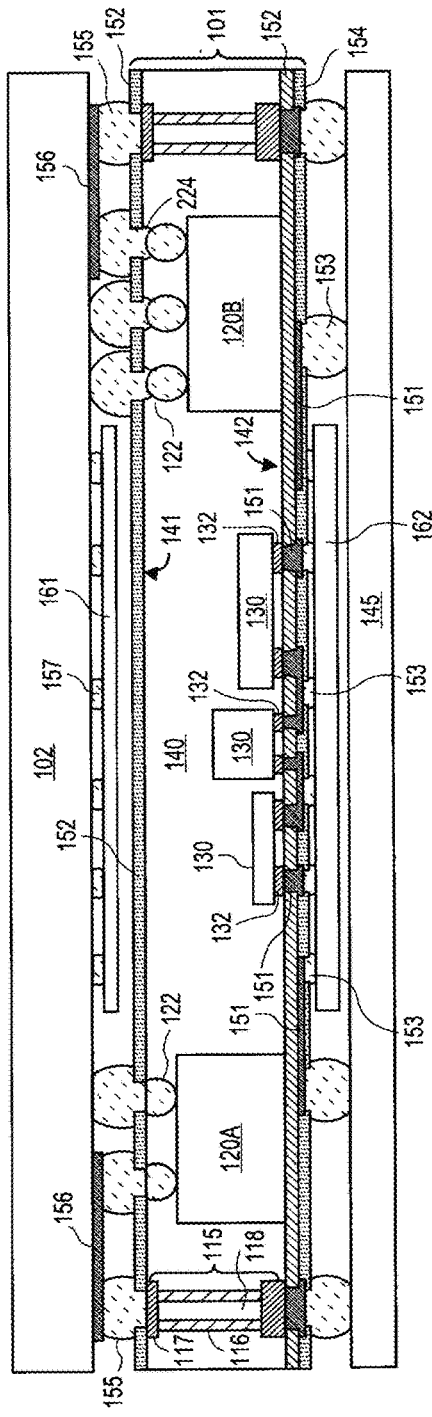
FIG. 1A
FIG. 1B

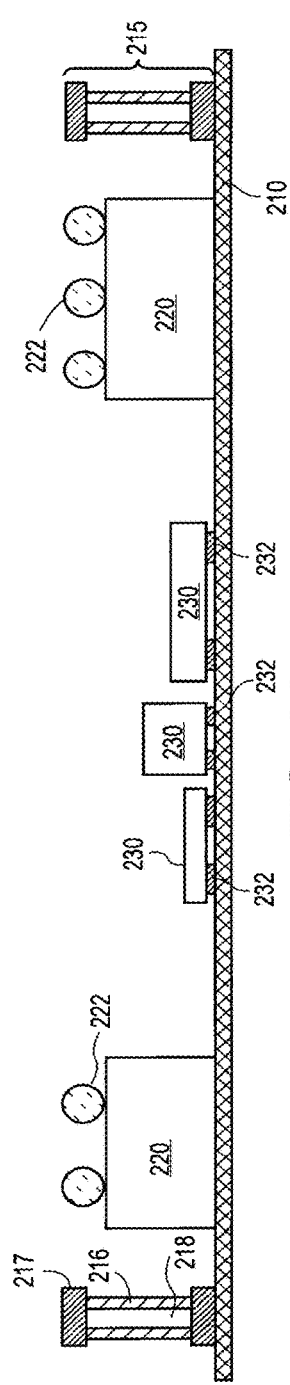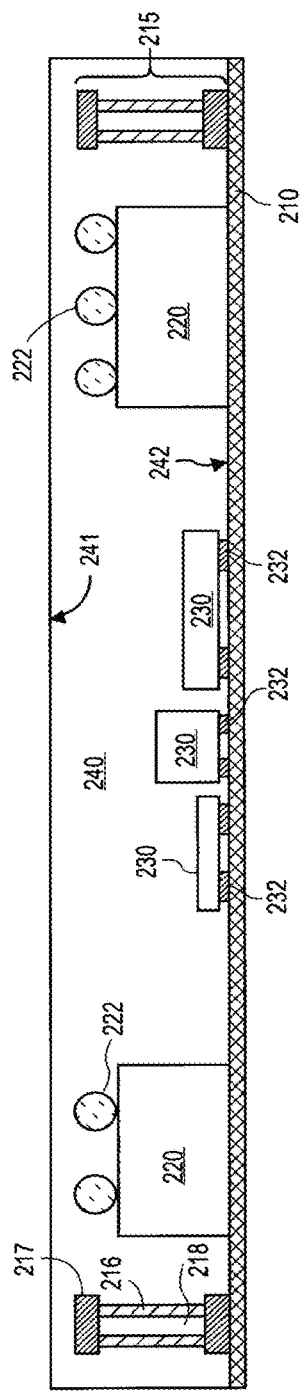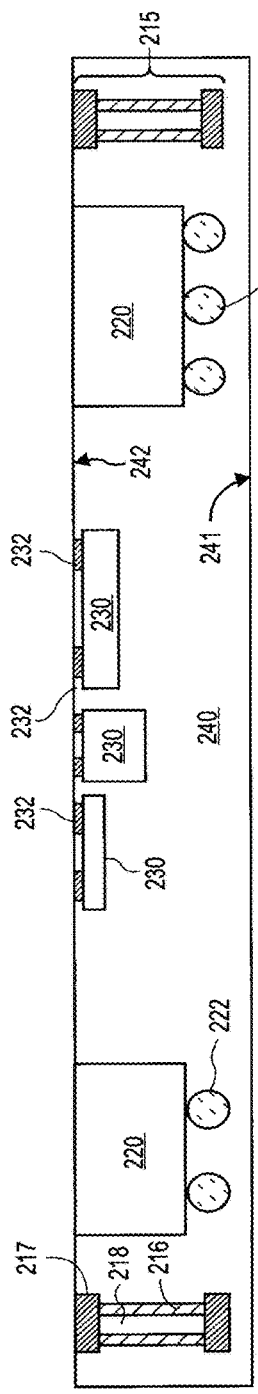

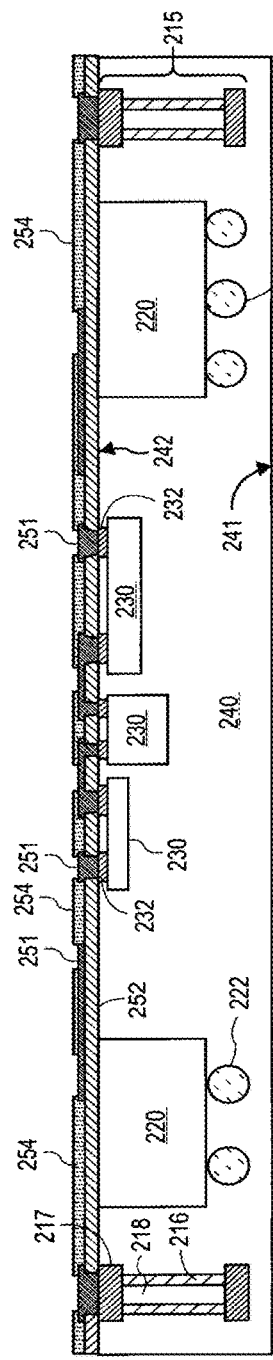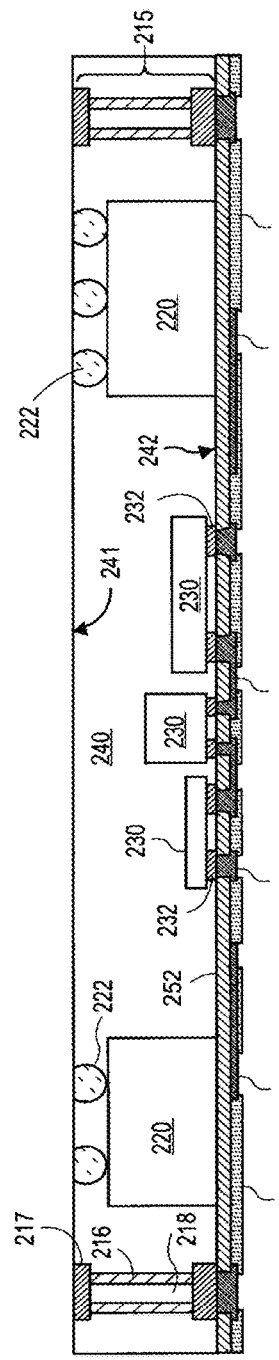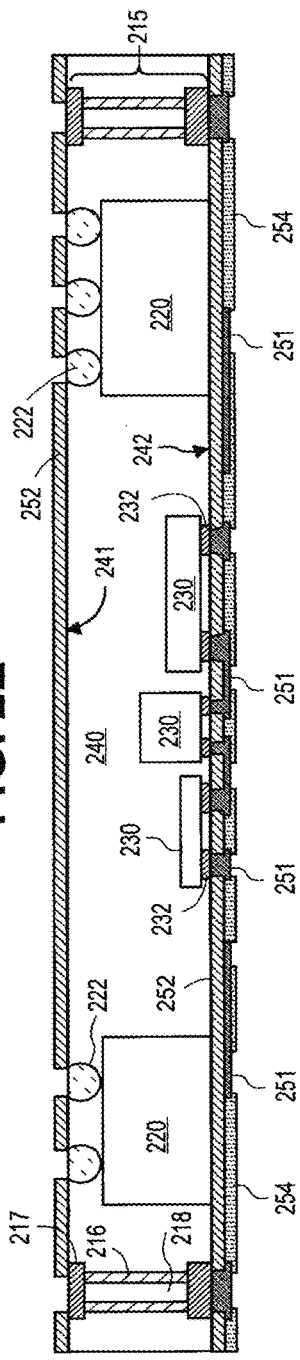

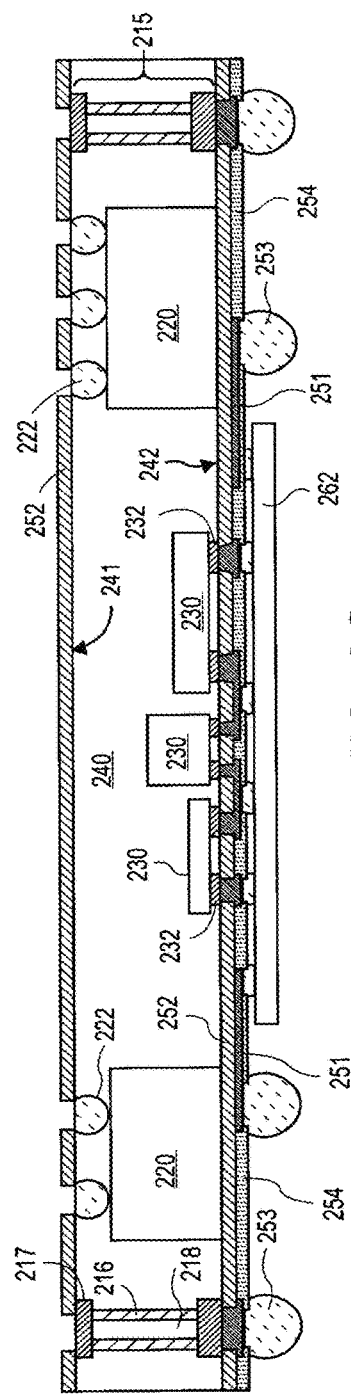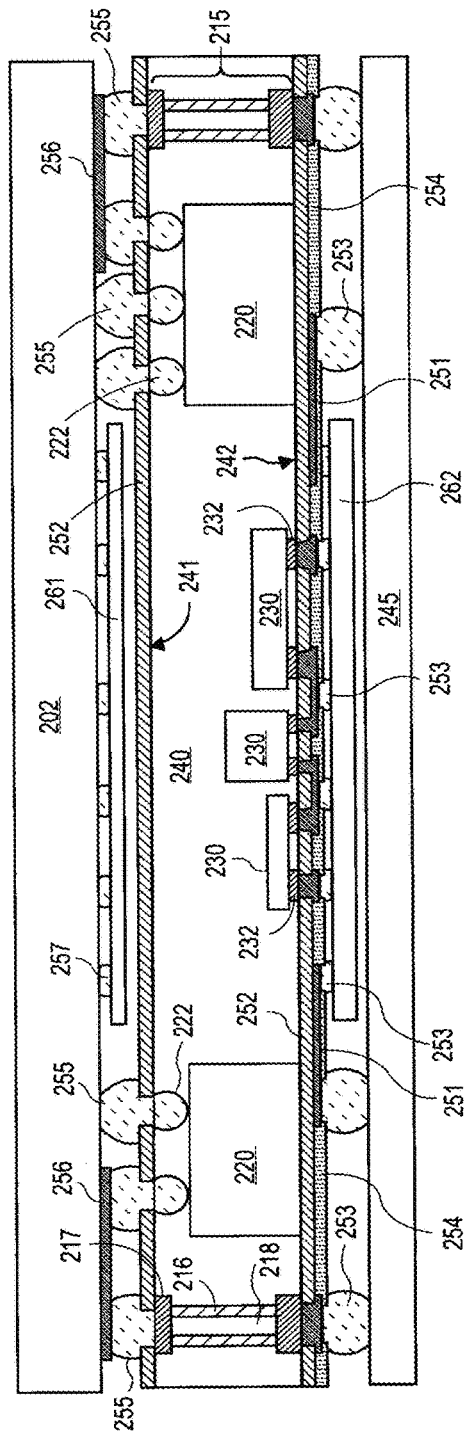

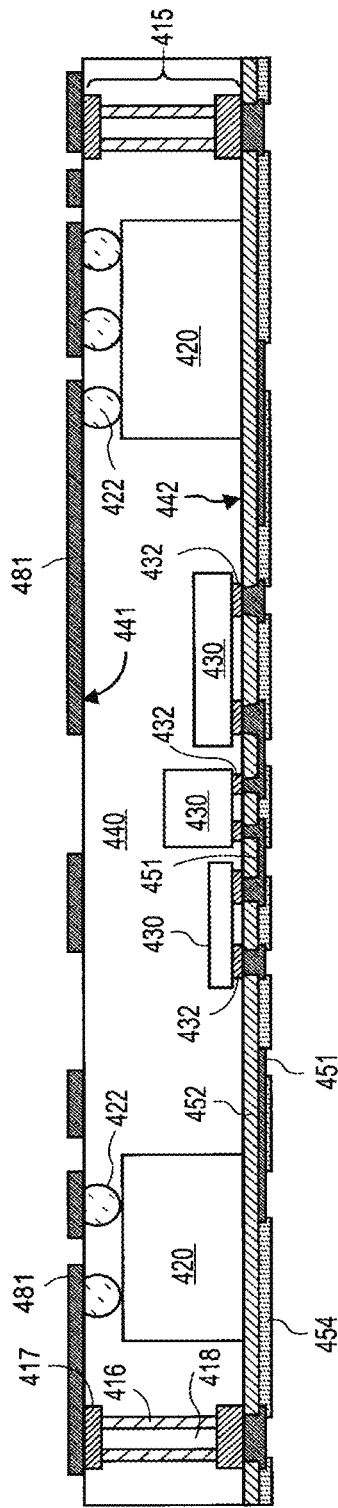
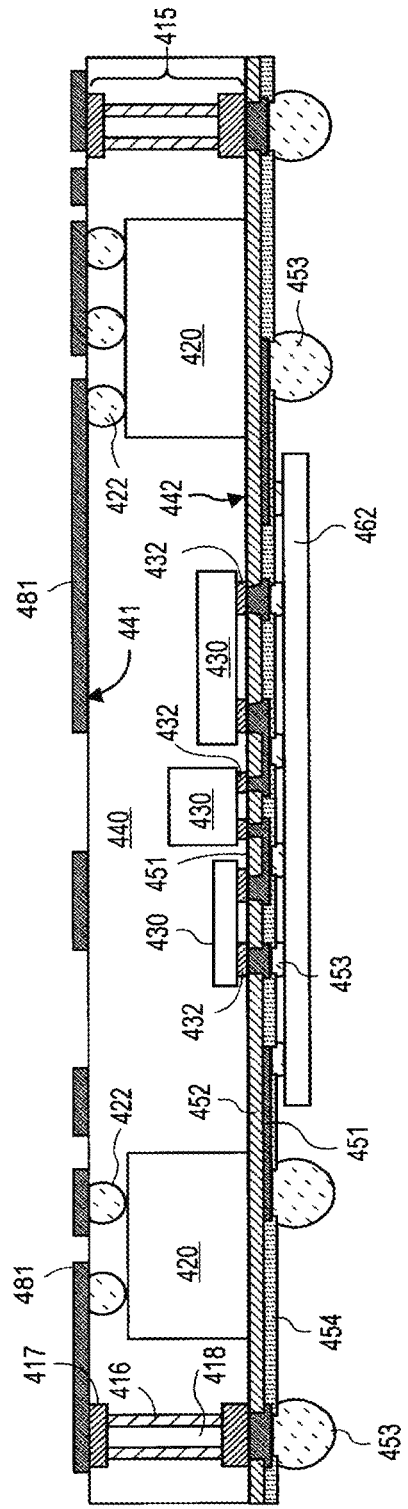
FIG. 4A
FIG. 4B

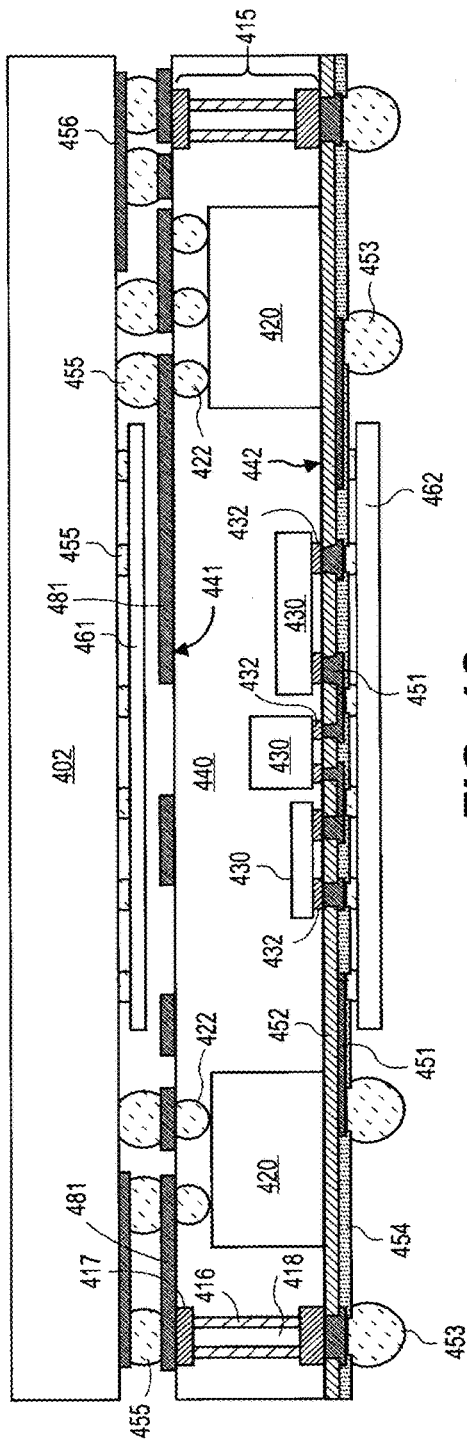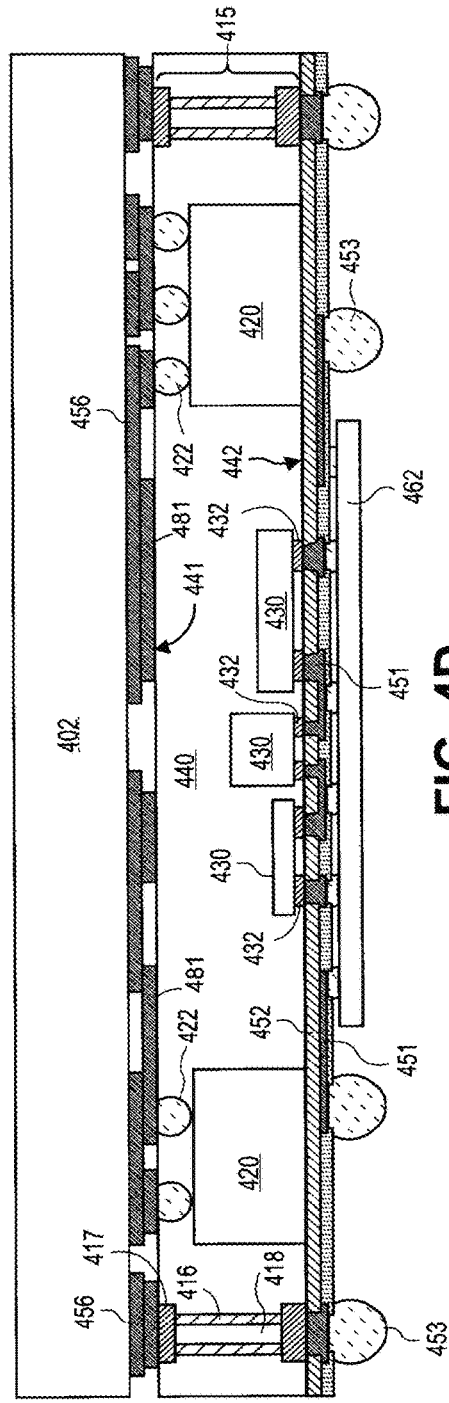
FIG. 4C
FIG. 4D

METHOD OF EMBEDDING WLCSP COMPONENTS IN E-WLB AND E-PLB

CROSS-REFERENCE TO RELATED APPLICATIONS

This application is a Divisional of U.S. patent application Ser. No. 14/767,902, filed on Aug. 13, 2015, which is a US National Phase Application under 35 U.S.C. § 371 of International Application No. PCT/US2014/056406, filed Sep. 18, 2014 the entire contents of which are hereby incorporated by reference herein.

FIELD OF THE INVENTION

Embodiments generally relate to semiconductor devices. More specifically, embodiments relate to methods and apparatuses for packaging semiconductor devices.

BACKGROUND OF THE INVENTION

In order to minimize the space required for electronic components used in mobile products, such as mobile communication devices and wearable devices, a multi-die system in package (SiP) may be used. In a SiP package, multiple active electronic components with different functionalities may be included within a single package. For example, active electronic components may include one or more semiconductive dies with integrated circuitry, such as transistors, diodes, or the like. A SiP may also include one or more passive electronic components, such as resistors, capacitors, integrated passive devices (IPDs) or the like. Often, the entity that assembles the SiP does not produce each of the electrical components that are integrated into the SiP. Electronic components that are obtained from an outside source are typically received pre-packaged. These pre-packaged components may not be suitable for integration into a SiP when certain packaging processes are used.

For example, a SiP may be formed with an embedded wafer level ball grid array (e-WLB) or an embedded panel level ball grid array (e-PLB) processes. In such packages, a mold layer is formed around a plurality of active and passive electrical components to form a reconstituted wafer or a reconstituted panel. A redistribution layer may then be formed over the surface of the mold layer to allow interconnects to the terminals to fan-out beyond the edges of the electrical component. In e-WLB and e-PLB packages, the electronic components typically utilize gold, aluminum, or copper terminals.

However, it is not always possible to obtain the desired electrical component with copper, aluminum, or gold terminals when components are received pre-packaged from an outside source. Instead, pre-packaged electronic components may include solderable terminals, such as solder balls. The use of solderable materials, such as tin-based solders, may reduce the reliability of the SiP. The reduction in the reliability of the device may result from the formation of intermetallic compounds (IMCs) at the solderable terminal. For example, during high temperature operations where a redistribution layer, such as a copper redistribution layer, is in contact with a solderable terminal, the copper may diffuse into the solder and produce IMCs. The volume of the IMCs is lower than the volume of the solder and may produce voids within the terminal or cause the terminal to crack. Additionally, the volume of solder materials will increase during reflow operations by a low-single-digit percentage value of the original volume. This increase in volume will cause the package to crack when the solder terminal is embedded within a mold layer, unless there is excellent adhesion between the solder material and the mold layer.

BRIEF DESCRIPTION OF THE DRAWINGS

FIG. 1A is a cross-sectional illustration of a device package that includes pre-packaged components that are substantially the same thickness, according to an embodiment of the invention.

FIG. 1B is a cross-sectional illustration of a device package that includes pre-packaged components that are not the same thickness, according to an embodiment of the invention.

FIGS. 2A-2H are cross-sectional illustrations that depict various processing operations that may be used to form a package, according to an embodiment of the invention.

FIGS. 4A-4D are cross-sectional illustrations that depict various processing operations that may be used to form packages, according to additional embodiments of the invention.

DETAILED DESCRIPTION OF THE INVENTION

Figure 3:
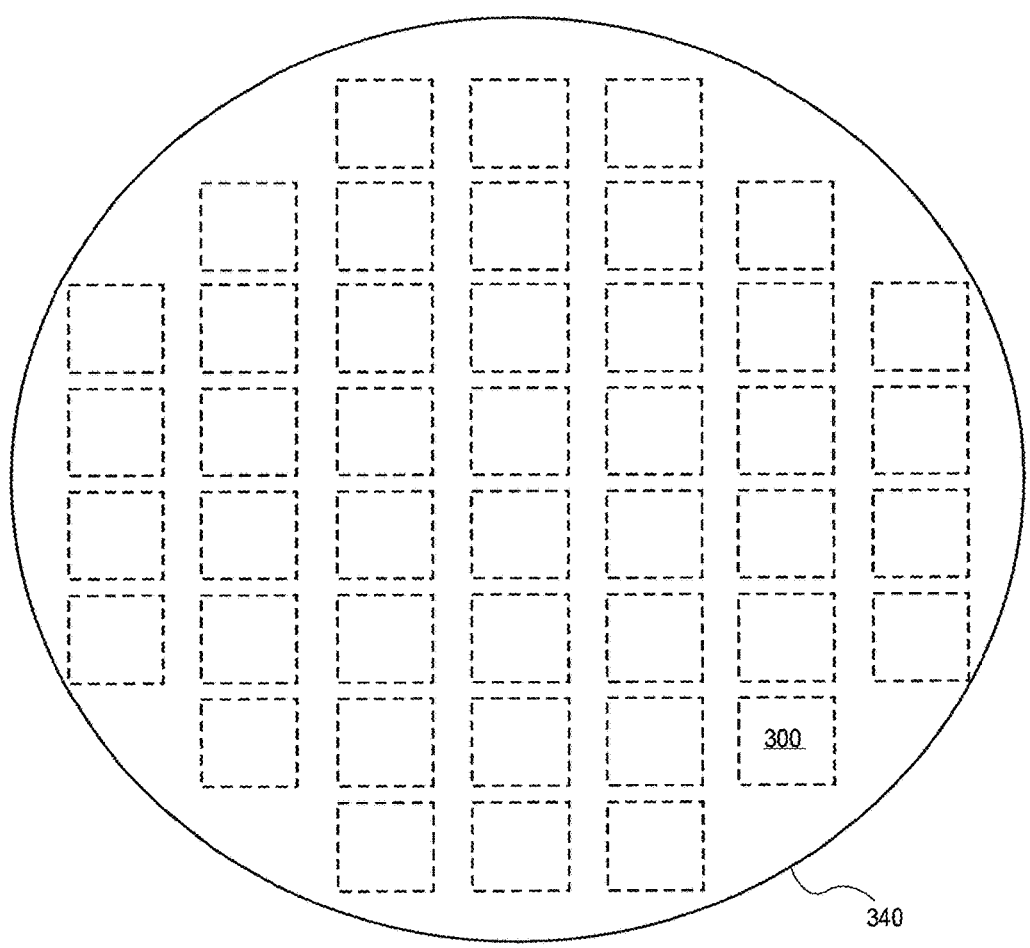
FIG. 3 is a schematic plan view of a plurality of device packages formed in a mold layer at the wafer level, according to an embodiment of the invention.

Embodiments of the invention include a device package and methods of forming such device packages. In the following description, numerous specific details are set forth, such as specific materials and processing operations, in order to provide a thorough understanding of embodiments of the present invention. It will be apparent to one skilled in the art that embodiments of the present invention may be practiced without these specific details. In other instances, well-known features, such as the integrated circuitry of semiconductive dies, are not described in detail in order to not unnecessarily obscure embodiments of the present invention. Furthermore, it is to be understood that the various embodiments shown in the Figures are illustrative representations and are not necessarily drawn to scale.

Embodiments of the invention allow for the integration of pre-packaged electrical components into a multi-die package, such as a SiP, that is formed with an e-WLB or e-PLB process. The reliability issues resulting from the formation of IMCs in solderable terminals described above is overcome by orienting the pre-packaged components such that the solderable terminals are isolated and protected during various processing operations. In an embodiment, the solderable terminals are embedded in a mold layer and are oriented to face a first surface of the mold layer, whereas electrical components with terminals that are not susceptible to IMC formation are oriented such that the terminals are exposed along a second surface of the mold layer. After the second surface has been processed to form a redistribution layer, the first surface of the mold layer may be recessed to expose the solderable terminals.

Referring now to FIG. 1A, a device package 100 according to an embodiment of the invention is illustrated. According to an embodiment, the device package 100 is a multi-die package that includes one or more pre-packaged components 120 with solderable terminals 122 that are embedded in a mold layer 140. Pre-packaged components 120 are oriented such that the terminals 122 are facing a first surface 141 of the mold layer 140. As shown in the embodiment illustrated in FIG. 1A, the device package 100 has two pre-packaged components 120, though embodiments are not limited to such configurations. For example, a device package 100 may include one or more pre-packaged components 120. According to an embodiment, the pre-packaged components 120 may be active and/or passive electronic components. For example, the active components may be semiconductor dies with integrated circuitry that include transistors, diodes, or the like. In embodiments, an active electronic component may be a microprocessor, chip set components, a graphics processor, analog devices, radio frequency integrated circuits (RFICs), or the like. Passive components may include resistors, capacitors, or the like, or IPDs. In embodiments with two or more pre-packaged components 120, each pre-packaged component may have a different function. For example, a first pre-packaged component 120A may include RFICs and a second pre-packaged component 120B may be an analog device. In an additional embodiment, a first pre-packaged component 120A may be a microprocessor and a second pre-packaged component 120B may be a graphics processor. According to additional embodiments, two or more pre-packaged components 120 may serve substantially the same function.

Embodiments of the invention include pre-packaged components 120 that have solderable terminals 122 that are formed with a material that is susceptible to the formation of intermetallic compounds. For example, the solderable terminals 122 may be a tin based solder terminal. According to embodiments, the pre-packaged components 120 may be any package type that utilizes solderable terminals. By way of example, the pre-packaged components 120 may be wafer level chip scale packages (WLCSPs). The solderable terminals 122 illustrated in FIG. 1A are solder balls, but other solderable terminal types may also be used. For example, the solderable terminals may be controlled collapse chip connection (C4) bumps, a land grid array (LGA), or the like.

The device package 100 may also include one or more electrical components 130 disposed within the mold layer 140. Electrical components 130 are oriented such that the terminals 132 face a second surface 142 of the mold layer 140 that is opposite the first surface 141. As such, solderable terminals 122 and the second type of terminals 132 are exposed along different surfaces of the mold layer 140. Embodiments of the invention may include components 130 that are active and/or passive electrical components. As illustrated in FIG. 1A, there are three electrical components 130, though embodiments are not limited to such configurations.

According to an embodiment, components 130 have a second type of terminal 132 that is not susceptible to IMC formation. For example, the second type of terminal 132 may be a high melting point conductive material that does not melt at reflow temperatures. In an embodiment, the second type of terminal 132 may include one or more layers of conductive materials. By way of example, the second type of terminal may be copper, aluminum, aluminum-copper alloy, gold, an alloy of copper or gold, or other metals and alloys that are not susceptible to IMC formation. In an embodiment of the invention, the components 130 are not packaged components. However, embodiments may include pre-packaged components 130, like quad-flat no-leads (QFN) packages, when the packaging includes the use of a second type of terminal 132.

According to an embodiment, the package 100 may further include one or more conductive vias formed through the mold layer 140. In an embodiment, one or more of the conductive vias may be a laser drilled through via that is filled with conductive material, such as copper, a through mold via (TMV), a via bar or any combination thereof. An embodiment that includes the use of via bars 115 is illustrated in FIG. 1A. The one or more via bars 115 provide a conductive path between the first surface 141 and the second surface 142 of the mold layer 140. As such, the solderable terminals 122 that are oriented towards the first surface 141 may be electrically coupled to the second surface 142 of the mold layer. Therefore, electrical connections to a substrate 145, such as a printed circuit board (PCB), may be made from the solderable terminals 122 that face the first surface 141 and from the second type of terminals 132 that face the second surface 142 of the mold layer 140.

Via bars 115 may be pre-fabricated vias that include one or more conductive vias 118 formed through a core layer 116. The core layer 116 may be a laminated dielectric, epoxy based or epoxy blend based, silicon or a ceramic material. In an embodiment, the core may be filled with filler particles, such as, for example, silicon or glass filler particles. Additional embodiments may include a core that does not include filler particles. Each of the vias 118 in the via bars 115 may connect land pads 117 formed on opposite sides of the via bar 115. By way of example, the land pads 117 may be copper or any other suitable conductive material.

According to the embodiment illustrated in FIG. 1A, the top surfaces of the solderable interconnects 122 and the top surfaces of the upper land pads 117 are substantially coplanar with the first surface 141 of the mold layer 140. Such embodiments are possible when the pre-packaged components 120 and via bars 115 are substantially the same thickness. However, additional embodiments are not limited to such configurations.

For example, in FIG. 1B, a multi-die package 101 that is substantially similar to the multi-die package 100 illustrated in FIG. 1A is shown. Package 101 is different from package 100 because a first pre-packaged die 120A has a thickness that is not equal to the thickness of a second pre-packaged die 120B. For example, in FIG. 1B, pre-packaged die 120A is thicker than pre-packaged die 120B. As such, embodiments of the invention may include one or more openings 124 is formed into the mold layer 140 to expose portions of the solderable interconnects 122 of the thinner pre-packaged die 120B. Since the pre-packaged components 120 may not be produced by the entity assembling the multi-die package, it may not be possible to control the thickness of each pre-packaged component 120. Therefore, embodiments that include openings 124 allow for increased flexibility in the design of a multi-die package because the selection of pre-packaged components 120 is not limited by package thickness considerations.

Returning back to FIG. 1A, a redistribution layer 151 may be formed over the second surface 142 of the mold layer 140. The redistribution layer 151 may include one or more conductive traces that couple each terminal 132 to an interconnect 153. The conductive traces allow for the interconnects 153 to fan-out beyond the perimeter of the component 130 to which the interconnects 153 are electrically coupled. By way of example, the redistribution layer 151 is a conductive layer, such as a copper layer. As used herein, a redistribution layer may include a single metal layer, a stack of different metal layers, or alloys. For example, the redistribution layer 151 may include barrier layers, seed layers, stacks of different metals, or alloys, etc. By way of example, the interconnects 153 may be solder balls.

As shown in the illustrated embodiment, a dielectric layer 152 may be formed between the redistribution layer 151 and the second surface 142 of the mold layer 140. By way of example, the dielectric layer 152 may be a polymer material, such as, for example, polyimide, epoxy or Ajinomoto build-up film (ABF). The dielectric layer may be patterned to provide openings to the terminals 132 and to the lower land pads 117 of the via bars 115.

According to additional embodiments, the redistribution layer 151 may be formed in direct contact with the second surface 142 of the mold layer 140 and the dielectric layer 152 may be omitted. Embodiments may also include a solder resist layer 154 that is formed over portions of the redistribution layer 151. While a single redistribution layer 151 and a single dielectric layer 152 are illustrated in the embodiment depicted in FIG. 1A, embodiments are not limited to such configurations. For example, a package 100 may include two or more redistribution layers 151 and/or zero, one, or two or more dielectric layers 152, according to additional embodiments.

Referring again to FIG. 1A, in an embodiment, a second package 102 may be coupled to package 100. In an embodiment, the second package 102 is positioned above package 100. In order to not unnecessarily obscure the illustration, the second package 102 is illustrated schematically as a block. However, embodiments of the invention include a second package 102 that may be any type of device package, such as, for example, a WLCSP, an e-WLB package, a flip chip package, a wire-bonded package, an e-PLB package, or a SiP package that is substantially similar to package 100. The second package 102 may include one or more active or passive components (not shown). According to an embodiment, the second package 102 may also be a substrate that includes a plurality of conductive traces 156, such as a printed circuit board (PCB). As illustrated, the second package 102 may be electrically coupled to substrate 145 by one or more via bars 115. By way of example, interconnects 155 may be solder balls. Package 102 may also be electrically coupled to pre-packaged components 120 by interconnects 155. While FIG. 1A illustrates the solderable terminals 122 and the interconnects 155 as being distinct components, it is to be appreciated that during a reflow operation, the interconnects 155 and the solderable terminals 122 may melt and merge together.

According to an embodiment, the second package 102 may also electrically couple the pre-packaged components 120 to the substrate 145. As illustrated in the embodiment depicted in FIG. 1A, an electrical path 171 may be formed from the substrate 145, through a via bar 115, to a solder bump 155 connecting the via bar 115 to the second package 102, and from the second package 102, through a solder bump 155 connected to the solderable terminal 122 of the pre-packaged component 120. In an embodiment, an electrical path 172 may be made from the substrate 145, through a via bar 115, through a solder bump 155 to a conductive trace 156 formed on a surface of the second package 102, and through a second solder bump 155 to the solderable terminal 122 of the pre-packaged component 120. Configuring the electrical paths 171 and/or 172 so that they are routed through (or on a surface of) the second package 102 allows for the solderable terminals 122 to be electrically coupled to the other components 130 of the package 100 and the substrate 145 without requiring the formation of a redistribution layer on the first surface 141 of the mold layer 140. Therefore, the solderable terminals 122 are not exposed to additional materials, such as copper, that may diffuse into the solderable terminal 122 and form IMCs.

Additional embodiments of the invention may also include one or more die 162 formed between package 100 and the substrate 145. By way of example, a die may be electrically coupled to the components 130 by one or more solder bumps 153. The die may be any semiconductive die, such as, for example, a memory chip, a microprocessor, or the like, but also can be a passive device like an IPD. Additional embodiments include a package 100 that does not include an additional die 162 formed between the second surface 142 of the mold layer 140 and the substrate 145. As illustrated, embodiments may also include an additional die 161 electrically coupled to a bottom surface of the second package 102 by solder bumps 157. Additional embodiments include a package 100 that does not include a die 161 formed between the second package 102 and the first surface 141 of the mold layer 140.

Referring now to FIGS. 2A-2H, a method of forming a multi-die package is illustrated. In FIG. 2A, a plurality of electrical components are mounted to a mold carrier 210. In an embodiment, a pick and place tool or a chip shooter may be used to mount the components 220 to the mold carrier 210. By way of example, the mold carrier 210 may include an adhesive layer (not shown) to secure the components to the mold carrier 210.

In an embodiment, one or more of the electrical components are pre-packaged components 220 that have solderable terminals 222. For example, in FIG. 2A, two separate pre-packaged components are mounted to the mold carrier 210. As illustrated, the pre-packaged components 220 are mounted to the mold carrier 210 so that the backside of the pre-packaged components 220 are supported by the mold carrier 210 and the solderable terminals 222 are facing away from the mold carrier 210. It is to be appreciated that the pre-packaged components 220 and the solderable terminals are substantially similar to those described above with respect to FIG. 1A, and as such, a detailed description of these components will not be repeated here.

One or more of the electrical components mounted to the mold carrier 210 may also be components 230 that are substantially similar to the components 130 described with respect to FIG. 1A. As illustrated, the components 230 are mounted to the mold carrier 210 such that the second type of terminals 232 are supported by the mold carrier 210 and the backside of the components 230 are facing away from the mold carrier 210. Accordingly, the solderable terminals 222 of the pre-packaged components 220 are oriented such that they face a direction that is opposite from the direction that the second type of terminals 232 are oriented to face.

Additional embodiments may also include mounting one or more via bars 215 to the mold carrier 210. By way of example, via bars 215 may be a pre-fabricated via that includes land pads 217 on either side of the via 218. The via bars 215 may include a plurality of vias 218 extending in the Z-direction between land pads 217. By way of example, the via bars 215 may include a ceramic, polymer, silicon or laminated core 216.

According to an embodiment, the thickness of each of the pre-packaged components 220 are substantially uniform. As such, the solderable interconnects 222 are each positioned at substantially the same level in the Z-direction. Furthermore, the thickness of the via bars 215 may be chosen such that the top land pad 217 is located at approximately the same height as the solderable interconnects 222. Having each of the solderable interconnects 222 and the land pads 217 formed along substantially the same plane in the Z-direction allows for each of the interconnects 222 and land pads 217 to be exposed when the first side 241 of the mold layer 240 is recessed in a subsequent processing operation described below.

Since the pre-packaged component 220 may be received from an outside supplier, it may not be possible to obtain packaged component 220 that each have the same thickness. In such situations, embodiments of the invention may also include an optional backside grinding process that normalizes the thickness of the pre-packaged component 220 prior to the dies being mounted to the mold carrier 210. However, it is to be appreciated that embodiments of the invention may also use pre-packaged component 220 that have non-uniform thicknesses. Such embodiments are described in greater detail below.

Referring now to FIG. 2B, a mold layer 240 is formed over the components and the mold carrier 210. By way of example, the mold layer 240 may be a polymeric material or an epoxy. In an embodiment, the mold layer 240 may be filled with filler particles, made of silicon, glass or the like. In an embodiment, the mold layer is formed with a compression molding process. The mold layer 240 has a thickness that ensures that a first surface 241 of the mold layer 240 is formed above the solderable terminals 222 and the upper land pads 217 of the via bars 215. Embedding the solderable terminals 222 in the mold layer 240 allows for the solderable terminals 222 to be isolated and protected during subsequent processing operations. As such, the solderable terminals 222 are not susceptible to IMC formation during subsequent processing operations. In an embodiment, surfaces of the second type of interconnects 232 are substantially coplanar with a second surface 242 of the mold layer 240. In the illustrated embodiment, the second surface 242 of the mold layer 240 is in contact with the mold carrier 210. However, it is to be appreciated that when an adhesive layer is formed over the mold carrier 210, then the interconnects 232 may be substantially coplanar with, and in contact with, a surface of the adhesive layer.

According to an embodiment, the package is flipped upside down, as shown in FIG. 2C. As illustrated, the first surface 241 may now be facing downwards and the second surface 242 may now be facing upwards. Additionally, the mold carrier 210 may be removed. In embodiments that include an adhesive layer, the adhesive layer may also be removed. In an embodiment, after the mold carrier 210 has been removed, surfaces 233 of the second type of interconnects 232 are exposed.

The cross-sectional illustration of the mold layer 240 in FIG. 2C provides a view of a portion of the mold layer 240. However, it is to be appreciated that one or more multi-die packages may be formed from a single mold layer. For example, FIG. 3 is a schematic plan view of a mold layer 340 formed at the wafer level. A plurality of multi-die packages 300 may be formed within the mold layer 340. In an embodiment, a multi-die package 300 may be embedded within the area of the mold layer 340 surrounded by each of the dashed boxes. While FIG. 3 depicts the formation of a plurality of packages formed at the wafer level, it is to be appreciated that substantially similar processing operations may be implemented on a panel sized mold layer, or a mold layer of any desired size, according to various embodiments. Subsequent to the formation of the multi-die packages at the wafer (or panel) level, each of the individual multi-die packages may be singulated from the wafer (or panel). For example, the singulation may be performed with a saw or a laser.

Returning back to the process flow in FIG. 2D, a dielectric layer 252 may be formed over the second surface 242 of the mold layer 240. By way of example, the dielectric layer 252 may be a nitride polymer material, such as, for example, a polyimide, polybenzoxazole (PBO), ABF, or epoxy based material. In an embodiment the dielectric layer 252 may be deposited with a deposition process, such as for example, spin coating or lamination. The dielectric layer 252 may be patterned to provide openings to the terminals 232 and to the land pads 217 of the via bars 215. In an embodiment, the patterning may be done via phot-lithography (e.g., mask aligner, or stepper) or laser (e.g., laser direct imaging (LDI) or laser removal).

According to an embodiment, a redistribution layer 251 may be formed over the dielectric layer 252 and be electrically coupled to one or more of the second type of terminals 232. In an embodiment, the redistribution layer may be any conductive layer. A redistribution layer may include a single metal layer, a stack of different metal layers, or alloys. For example, the redistribution layer 151 may include seed layers, barrier layers, stacks of different metals, or alloys, etc. In an embodiment, the redistribution layer 251 may be formed with processes known in the art, such as electroplating, electroless plating, sputtering, printing, jetting, or any combination thereof.

According to an embodiment, a solder resist 254 may be formed over portions of the dielectric layer 252 and the redistribution layer 251. The solder resist layer 254 may consist of a polymer layer. While a single redistribution layer 251 and a single dielectric layer 252 are illustrated in FIG. 2D, embodiments of the invention are not limited to such configurations. For example, two or more redistribution layers 251 and/or two or more dielectric layers 252 may be formed according to additional embodiments. In yet another embodiment, the redistribution layer 251 may be formed directly over the second surface 241 of the mold layer 240 and the dielectric layer 252 may be omitted.

During the formation of the redistribution layer 251, the solderable interconnects 222 are isolated within the mold layer 240. Accordingly, the solderable interconnects 222 are not in contact with the redistribution layer 251. This prevents the formation of IMCs in the solderable interconnects 222 that may otherwise occur if the solderable interconnects 222 are contacted by the redistribution layer during the formation of the redistribution layer 251 or during processing operations subsequent to the formation of the redistribution layer 251.

Referring now to FIG. 2E, in an embodiment, the mold layer 240 may be flipped over again so that the first surface 241 of the mold layer 240 is facing upwards and the second surface 242 of the mold layer 240 is facing downwards. The first surface 241 of the mold layer 240 may then be recessed to expose the solderable interconnects 222 of the pre-packaged dies 220 and to expose surfaces of the land pads 217 of the via bars 215. By way of example, the first surface 241 may be recessed with a grinding or fly cut process. In an embodiment, portions of the solderable terminals 222 and/or the land pads 217 may be removed when the first surface 241 of the mold layer 240 is recessed.

According to an additional embodiment, the solderable interconnects 222 may be exposed with a combination of a recessing process and a laser ablation process. Such embodiments may be beneficial when the pre-packaged components 220 do not have the same thickness. For example, referring back to FIG. 1B, a first pre-packaged component 120A may have a thickness that is greater than the thickness of a second pre-packaged component 120B. As such, the first surface 141 of the mold layer 140 may be recessed in order to expose portions of the solderable interconnects on the first pre-packaged component 120A. Thereafter, a laser ablation process may be utilized in order to form openings 124 that expose portions of the solderable interconnects 122 of the second pre-packaged die 120B. Subsequent to the laser ablation process to provide openings 124, the processing used to form a package with pre-packaged components with different thicknesses may be substantially similar to the processing operations illustrated in FIGS. 2F-2H, and therefore, will not be repeated here.

Referring now to FIG. 2F, in an embodiment, a dielectric layer 252 may be formed over the first surface 241 of the mold layer 240 and over the exposed solderable interconnects 222 and the land pads 217 of the via bars 215. The dielectric layer 252 formed over the first surface 241 may be substantially similar to the dielectric layer 252 formed over the second surface 242. For example, the dielectric layer 252 may be a polymer material. Embodiments include forming the dielectric layer 252 with deposition processes, such as, for example spin coating or lamination. According to an embodiment, the dielectric layer may then be patterned to expose the solderable interconnects 222 and the land pads 217. According to an embodiment, the dielectric layer 252 formed over the first surface 241 may optionally be omitted. Alternative embodiments include forming a redistribution layer over the dielectric layer 252 formed over the first surface 241 as well. An embodiment with such a redistribution layer is described in greater detail below with respect to FIGS. 4A-4D. When a redistribution layer is formed over the first surface 241, a solder resist layer may optionally be formed over the dielectric layer 252 and portions of the redistribution layer.

Thereafter, as illustrated in FIG. 2G, solder balls 253 may be formed on exposed portions of the redistribution layer 251 on the second surface 242 of the mold layer 240. According to an embodiment, the solder balls 253 may not all be the same size. The presence of smaller solder balls 253 allows for an additional die 262 to be coupled to the package below the mold layer 240. According to an embodiment, the additional die 262 may be an additional active component, such as, for example, a microprocessor, a memory device, a chipset, analog devices, RFICs, or the like, or any combination thereof. While the package illustrated in FIG. 2F includes an additional die 262, embodiments may also include a package without an additional die 262.

According to an embodiment, a second package 202 may be mounted to the first side 241 of the mold layer 240 and a substrate 245, such as a PCB, may be mounted to the solder bumps 253, as illustrated in FIG. 2H. In order to not unnecessarily obscure the illustration, the second package 202 is illustrated schematically as a block. However, embodiments of the invention include a second package 202 that may be any type of device package, such as, for example, a WLCSP, an e-WLB package, an e-PLB package, or a SiP package. The second package 202 may include one or more active or passive components (not shown). According to an embodiment, the second package 202 may also be a substrate that includes a plurality of conductive traces 256, such as a printed circuit board (PCB). In an embodiment, a semiconductive die 261 may be coupled to the second package by solder interconnects 257.

According to an embodiment, the second package 202 is mechanically and electrically coupled to the multi-die package by one or more solder bumps 255. The second package 202 may have solder balls formed on its bottom surface. By way of example, the solder balls 255 may be pre-fabricated solder balls that are mounted with a ball drop process. After the second package 202 has been aligned and placed in contact with the package, the solder balls 255 may be reflown. In an embodiment the reflown solder balls merge with the solderable interconnects 222 of the pre-packaged dies 220.

The solder balls 255 may also electrically couple the second package 202 to the land pads 217 of the via bars 215. In an embodiment, one or more conductive traces 256 may electrically couple a reflown solder ball 255 formed over a land pad 217 to a reflown solder ball 255 formed over the solderable interconnect 222 of a pre-packaged die 220. Accordingly, an electrical path may be made from the substrate 245 and through a via bar 215, to the solder bump 255 connecting the via bar 215 to the second package 202, and from the second package 202 through a solder bump 255 connected to the solderable interconnect 222 of the pre-packaged component 220. Additionally, an electrical path may be made from the substrate 245, through a via bar 215, through a solder bump 255 to a conductive trace 256 formed on a surface of the second package 202, and through a second solder bump 255 to the solderable interconnect 222 of a pre-packaged component 220.

According to an additional embodiment illustrated in FIG. 4A, a redistribution layer 481 may be formed over the first surface 441 of the package in order to provide an additional electrical path from the second surface 442 of the mold layer 440 to the pre-packaged components 420. In such embodiments, the redistribution layer 481 allows for the electrical path to the pre-packaged components 420 to be made even when a second package 402 is not mounted above the first surface 441 of the mold layer 440. The process for forming such an embodiment follows substantially the same processing operations as those described above with respect to FIGS. 2A-2E and, therefore will not be repeated here. FIG. 4A is the next processing operation following the processing set forth above for FIGS. 2A-2E.

Referring again to FIG. 4A, a redistribution layer 481 is formed over the first surface 441 of the mold layer 440. In an embodiment, the redistribution layer 481 is a conductive material. By way of example the redistribution layer 481 may be a single layer or a stack of metal layers. In one embodiment a thick barrier layer such as nickel metal or a stack of nickel-tungsten-nickel layers may be formed on the solderable terminals 422 before depositing the copper interconnect layer. Accordingly, issues with IMC formation in the solderable terminals 422 are avoided since a barrier layer will limit or prevent the diffusion of copper into the solderable terminal. By way of example, the redistribution layer 481 may include an organic surface protectant (OSP) or a noble metal finish. Embodiments of the invention include forming the redistribution layer 481 with thin film deposition processes such as, chemical vapor deposition (CVD), physical vapor deposition (PVD), electroplating, electro-less plating, or the like. In an additional embodiment, a dielectric layer (not shown) may optionally be formed over the first surface 441 of the mold layer 440 prior to forming the redistribution layer 481. Embodiments may also include forming a solder resist layer (not shown) over portions of the dielectric layer and the redistribution layer 481. The inclusion of a redistribution layer 481 allows for an electrical connection to be made from the second surface 442 of the mold layer 440, through a via bar 415, and from the via bar 415 directly to a solderable interconnect 422 by way of the redistribution layer 481. As such, a connection to the pre-packaged components 420 may be made without the need for a second package 402 formed above the first surface 441 of the mold layer 440.

In an embodiment, solder balls 453 may be formed on exposed portions of the redistribution layer 451 on the second surface 442 of the mold layer 440, as shown in FIG. 4B. According to an embodiment, the solder balls 453 may not all be the same size. The presence of smaller solder balls 453 allows for an additional die 462 to be mechanically and electrically coupled to the package below the mold layer 440. According to an embodiment, the additional die 462 may be an additional active component, such as for example, a microprocessor, a memory device, a chipset, or the like, or any combination thereof. While the package illustrated in FIG. 4B includes an additional die 462, embodiments may also include a package without an additional die 462.

Thereafter, in FIG. 4C, a second package 402 is mounted on the first surface 441 of the mold layer 440 and a substrate 445, such as a PCB, may be mounted to the solder balls 455. As illustrated, the second package 402 may include a plurality of solder balls 455. The solder balls 455 may be reflown to electrically and mechanically couple the second package 402 to the redistribution layer 481. In an embodiment, a semiconductive die 461 may be coupled to the second package by solder balls 455. According to an embodiment, the second package 402 and the semiconductive die 461 may be substantially similar to the second package 202 and the semiconductive die 261 described above with respect to FIG. 2H, and therefore, a detailed description will not be repeated here.

According to an additional embodiment illustrated in FIG. 4D, the second package 402 may include a land grid array (LGA) 456 instead of solder balls 455. In such an embodiment, the second package 402 may be bonded to the redistribution layer 481 with a thermocompression bonding process. In an embodiment, the second package 402 may be bonded at wafer level (i.e., before each package 400 is singulated) or at the unit level (i.e., after each package 400 has been singulated).

Figure 5:
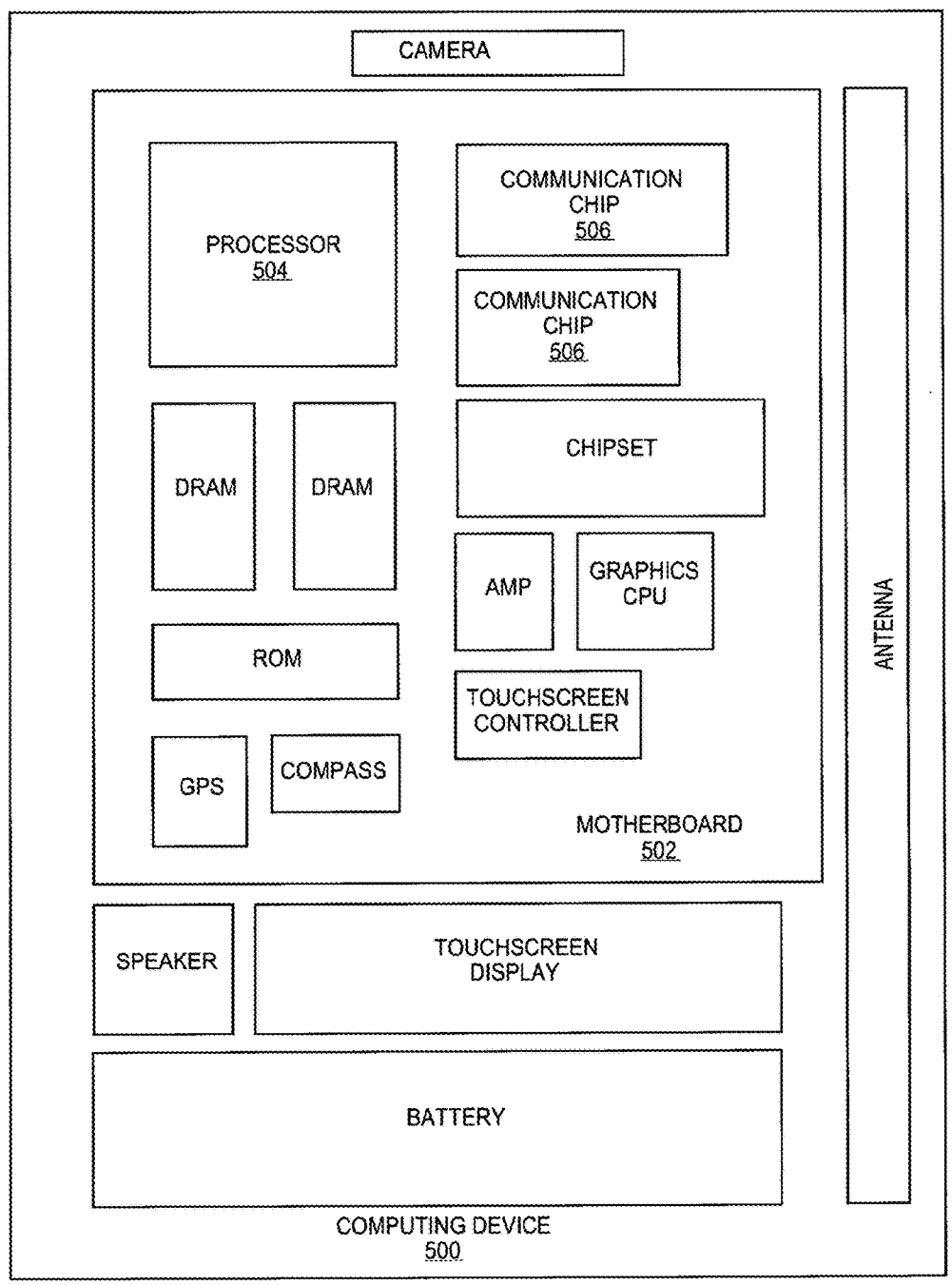
FIG. 5 is an illustration of a schematic block diagram of a computer system that utilizes a semiconductor package, according to an embodiment of the invention.

FIG. 5 illustrates a computing device 500 in accordance with an embodiment. The computing device 500 houses a board 502. The board 502 may include a number of components, including but not limited to a processor 504 and at least one communication chip 506. The processor 504 is physically and electrically coupled to the board 502. In some implementtations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a microelectromechanical system (MEMS), a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some embodiments, the integrated circuit die of the processor is packaged in a multi-die package including one or more pre-packaged components with solderable terminals that are oriented such that the solderable terminals face a first surface of a mold layer, and one or more electrical components that have a second type of terminal, where the second type of terminals are oriented such that they face a second surface of the mold layer that is opposite from the first surface, in accordance with an embodiment. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another embodiment, the integrated circuit die of the communication chip is packaged in a multi-die package including one or more pre-packaged components with solderable terminals that are oriented such that the solderable terminals face a first surface of a mold layer, and one or more electrical components that have a second type of terminal, where the second type of terminals are oriented such that they face a second surface of the mold layer that is opposite from the first surface, in accordance with an embodiment.

In further implementations, another component housed within the computing device 500 may contain an integrated circuit die that includes one or more devices, such as devices that are packaged in a multi-die package including one or more pre-packaged components with solderable terminals that are oriented such that the solderable terminals face a first surface of a mold layer and one or more electrical components that have a second type of terminal, where the second type of terminals are oriented such that they face a second surface of the mold layer that is opposite from the first surface, in accordance with an embodiment.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

An embodiment of the invention includes a multi-die package comprising, a mold layer having a first surface and a second surface that is opposite from the first surface, one or more first electrical components, wherein each of the first electrical components have a solderable terminal that is oriented to face the first surface of the mold layer, and one or more second electrical components, wherein each of the second electrical components have a second type of terminal that is oriented to face the second surface of the mold layer. An additional embodiment includes a multi-die package, wherein the solderable terminal is a tin-based solder and the second type of terminal comprises copper, gold, or aluminum. An additional embodiment includes a multi-die package, further comprising a redistribution layer formed over the second surface of the mold layer that is electrically coupled to one or more of the second type of terminals. An additional embodiment includes a multi-die package, further comprising a dielectric layer formed between the redistribution layer and the second surface of the mold layer. An additional embodiment includes a multi-die package, further comprising a solder resist layer formed over portions of the redistribution layer. An additional embodiment includes a multi-die package, further comprising one or more conductive through vias formed between the first surface of the mold layer and the second surface of the mold layer. An additional embodiment includes a multi-die package, wherein the one or more conductive through vias are via bars, wherein the via bars comprise, a first land pad that has a surface substantially coplanar with a first surface of the mold layer, a second land pad has a surface substantially coplanar with a second surface of the mold layer, a core layer disposed between the first and second land pads, and one or more vias formed through the core layer that electrically couple the first and second land pads. An additional embodiment includes a multi-die package, further comprising a second package electrically and mechanically coupled to one or more of the first electrical components and one or more of the conductive vias by solder balls. An additional embodiment includes a multi-die package, wherein the package is electrically and mechanically coupled to a substrate by one or more solder balls, and wherein the first electrical components are electrically coupled to the substrate by the second package and one or more of the conductive through vias. An additional embodiment includes a multi-die package, further comprising a second redistribution layer formed over the first surface of the mold layer that electrically couples one or more solderable terminals to one or more conductive through vias. An additional embodiment includes a multi-die package, wherein the first electrical components are pre-packaged components. An additional embodiment includes a multi-die package, wherein one or more of the first electrical components are wafer level chip scale packages. An additional embodiment includes a multi-die package, wherein the one or more first electrical components are substantially the same thickness. An additional embodiment includes a multi-die package, wherein at least one of the one or more first electrical components are thinner than other first electrical components. An additional embodiment includes a multi-die package, wherein an opening is formed from the first surface of the mold layer to expose the solderable terminals of the thinner first electrical component.

An additional embodiment of the invention includes a method of forming a multi-die package comprising, mounting one or more first electrical components on a mold carrier, wherein the first electrical components have solderable terminals that face away from the mold carrier, mounting one or more second electrical components on the mold carrier, wherein the second electrical components have a second type of terminal that is facing the mold carrier, mounting one or more via bars on the mold carrier, forming a mold layer over the mold carrier, wherein the mold layer has a first surface formed above the solderable terminals of the first electrical components and above the via bars and a second surface formed on the mold carrier, removing the mold carrier from the mold layer, forming a redistribution layer over the second surface of the mold layer, wherein the redistribution layer contacts one or more of the second type of terminals and a first land pad of the via bar, and recessing the first surface of the mold layer to expose one or more of the solderable terminals and a second land pad of the via bar. An additional embodiment includes a method further comprising, forming a dielectric layer over the second surface of the mold layer, and patterning the dielectric layer to expose the second type of terminals and one or more land pads of the via bars prior to forming the redistribution layer. An additional embodiment includes a method further comprising, forming solder balls on the redistribution layer and on the one or more land pads of the via bars, and mounting the mold layer to a substrate by reflowing the solder balls. An additional embodiment includes a method further comprising, electrically and mechanically coupling a second package to the solderable terminals and one or more of the via bars with one or more solder balls. An additional embodiment includes a method, wherein the solder balls that electrically and mechanically couple the second package to the solderable terminals are reflown and merge with the solderable terminals. An additional embodiment includes a method, wherein an electrical path is formed from the first electrical components to the substrate through the second package and through one or more of the via bars. An additional embodiment includes a method, wherein an electrical path is formed from the first electrical components to the substrate through a conductive trace formed on a surface of the second package and through one or more of the via bars.

An additional embodiment of the invention includes a multi-die package comprising, a mold layer having a first surface and a second surface that is opposite from the first surface, one or more first electrical components, wherein each of the first electrical components have a solderable terminal that is oriented to face the first surface of the mold layer, and wherein the solderable terminal is a tin-based solder, one or more second electrical components, wherein each of the second electrical components have a second type of terminal that is oriented to face the second surface of the mold layer, and wherein the second type of terminal comprises copper, gold, or aluminum, and one or more conductive through vias formed between the first surface of the mold layer and the second surface of the mold layer. An additional embodiment includes a multi-die package, wherein the one or more conductive through vias are via bars, wherein the via bars comprise, a first land pad that has a surface substantially coplanar with a first surface of the mold layer, a second land pad has a surface substantially coplanar with a second surface of the mold layer, a core layer disposed between the first and second land pads, and one or more vias formed through the core layer that electrically couple the first and second land pads. An additional embodiment includes a multi-die package, further comprising a second package electrically and mechanically coupled to one or more of the first electrical components and one or more of the conductive vias by solder balls, wherein the package is electrically and mechanically coupled to a substrate by one or more solder balls, and wherein the first electrical components are electrically coupled to the substrate by the second package and one or more of the conductive through vias.

What is claimed is:

1. A method of forming a multi-die package comprising:
mounting one or more first electrical components on a mold carrier, wherein the first electrical components have solderable terminals that face away from the mold carrier;
mounting one or more second electrical components on the mold carrier, wherein the second electrical components each have a second type of terminal that is facing the mold carrier;
mounting one or more via bars on the mold carrier;
forming a mold layer over the mold carrier, wherein the mold layer has a first surface formed that is coplanar with a surface of the solderable terminals of the first electrical components and above the via bars and a second surface formed on the mold carrier;
removing the mold carrier from the mold layer;
forming a redistribution layer over the second surface of the mold layer, wherein the redistribution layer contacts one or more of the second type of terminals and a first land pad of the via bar; and
recessing the first surface of the mold layer to expose one or more of the solderable terminals and a second land pad of the via bar.

2. The method of claim 1, further comprising:
forming a dielectric layer over the second surface of the mold layer; and
patterning the dielectric layer to expose the second type of terminals and one or more the first land pads of the via bars prior to forming the redistribution layer.

3. The method of claim 1 further comprising:
forming solder balls on the redistribution layer and on the one or more land pads of the via bars; and
mounting the recessed mold layer to a substrate by reflowing the solder balls.

4. The method of claim 3 further comprising, electrically and mechanically coupling a second package to the solderable terminals and one or more of the via bars with one or more solder balls.

5. The method of claim 4, wherein the solder balls that electrically and mechanically couple the second package to the solderable terminals are reflowed and merge with the respective solderable terminals.

6. The method of claim 5, wherein an electrical path is formed from the first electrical components to the substrate through the second package and through one or more of the via bars.

7. The method of claim 5, wherein an electrical path is formed from the first electrical components to the substrate through a conductive trace formed on a surface of the second package and through one or more of the via bars.

* * * * *